United States Patent [19]

Hidaka

[11] Patent Number: 5,051,815

[45] Date of Patent: Sep. 24, 1991

[54] LASER BEAM EMITTING UNIT WITH HIGH FREQUENCY NOISE SHUTOFF

[75] Inventor: Shinobu Hidaka, Sagamihara, Japan

[73] Assignee: Minolta Camera Kabushiki Kaisha, Osaka, Japan

[21] Appl. No.: 605,994

[22] Filed: Oct. 29, 1990

[30] Foreign Application Priority Data

Oct. 30, 1989 [JP] Japan .................................. 1-283627

[51] Int. Cl.⁵ .............................................. H01L 25/04
[52] U.S. Cl. ........................................ 357/84; 372/29; 372/81; 372/38
[58] Field of Search ....................... 372/38, 29, 32, 81; 357/84, 74

[56] References Cited

U.S. PATENT DOCUMENTS

| 3,946,428 | 3/1976 | Anazawa et al. | 357/84 |
| 4,266,239 | 5/1981 | Miyagaki et al. | 357/84 |
| 4,712,218 | 12/1987 | Ohnuki et al. | 372/38 |
| 4,799,069 | 1/1989 | Sasaki et al. | 372/31 |
| 4,819,242 | 4/1989 | Kaku et al. | 372/29 |
| 4,921,357 | 5/1990 | Karube et al. | 372/29 |
| 4,926,243 | 5/1990 | Nakagawa et al. | 357/84 |
| 4,939,375 | 7/1990 | Walters et al. | 357/84 |

Primary Examiner—Frank Gonzalez
Assistant Examiner—Susan S. Morse
Attorney, Agent, or Firm—Price, Gess & Ubell

[57] ABSTRACT

A laser beam emitting unit having a laser diode driven by a drive current containing a high-frequency pulse and a mechanism for preventing the high-frequency pulse of the drive current from causing the bad influence to the exterior electrically circuit.

6 Claims, 4 Drawing Sheets

LASER BEAM EMITTING UNIT WITH HIGH FREQUENCY NOISE SHUTOFF

BACKGROUND OF THE INVENTION

1. Field of the Invention

The present invention relates to a semiconductor laser, and more specifically relates to a laser beam emitting unit using a semiconductor laser as a light source.

2. Description of the Related Art

Various methods have been proposed for stabilizing the laser beam emitted by a laser diode (hereinafter referred to as "LD") for use as a laser beam light source. A typical method among the aforesaid methods superimposes a high-frequency pulse on a direct electric current (DC) as the driving current to drive a LD. Electromagnetic waves are generated in devices using the aforesaid method by the high-frequency pulse from the electric current flowing through a circuit or the like used to superimpose a high-frequency pulse on a direct electric current. When electromagnetic waves are generated, for example, when electromagnetic waves penetrate and produce noise in the control portion that controls the laser beam emitted by the laser beam source, the beam emitted by the LD cannot be accurately controlled, thereby causing impaired operation.

Therefore, conventional devices use a conductive case to shield the entire printed circuit board (PC board) containing the high-frequency pulse generating circuit and the entire portion wherein flows the electric current that contains the high-frequency pulse.

The high-frequency pulse generating circuit requires wiring to connect it to the external power source and control portion and the like. When an access hole is provided in the conductive casing for the wiring, said access hole must be blocked with a conductive material after the wiring is in place to prevent leakage of the high-frequency pulse from said wiring access hole, thereby greatly increasing the number of manufacturing process steps required.

Further, the previously mentioned conductive case must inevitably be large enough to cover the entire PC board containing the high-frequency pulse generating circuit and the entire portion wherein flows the electric current that contains the high-frequency pulse. Consequently, the device becomes larger in size, which produces the accompanying disadvantages of increased cost and increased space required for installation.

SUMMARY OF THE INVENTION

Accordingly, a main object of the present invention is to provide an improved laser beam emitting unit capable of eliminating the previously described disadvantages.

A further object of the present invention is to provide a laser beam emitting unit that does not allow external leakage of the high-frequency electromagnetic waves generated by the circuit for driving the laser diode.

A still further object of the present invention is to provide a compact and inexpensive laser beam emitting unit wherein the high-frequency electromagnetic waves generated within said laser beam emitting unit do not produce adverse effects externally thereto.

These and other objects are attained by a laser beam emitting unit providing a laser diode;

drive circuit for driving said laser diode by a drive current containing a high-frequency pulse;

connector terminals to electrically connect said drive circuit and the exterior;

circuit board having said drive circuit and connector terminals;

grounding pattern disposed so as to circumscribe the drive circuit portion excluding the circuit board and connector terminals;

conductive support member to support said circuit board so as to shield the entire rear face of said circuit board;

and a conductive cover to shield the drive circuit portion of the front face of said circuit board and which is electrically connected to the aforesaid grounding pattern.

BRIEF DESCRIPTION OF THE DRAWINGS these and other objects or features of the present invention will become apparent from the following description of a preferred embodiment thereof taken in conjunction with the accompanying drawings, in which.

In the following description, like parts are designated by like reference numbers throughout the several drawings.

DESCRIPTION OF THE PREFERRED EMBODIMENTS

The preferred embodiments of the present invention are hereinafter described with reference to the accompanying drawings.

The laser beam emitting unit shown in the present embodiment is used as a laser beam generating source in a laser printer, and the LD is controlled by ON/OFF control including light intensity modulation in accordance with image signals input thereto from an external source. The laser beam emitted from the LD is reflected by a polygonal mirror to scan a photoreceptive surface.

Figure 1:
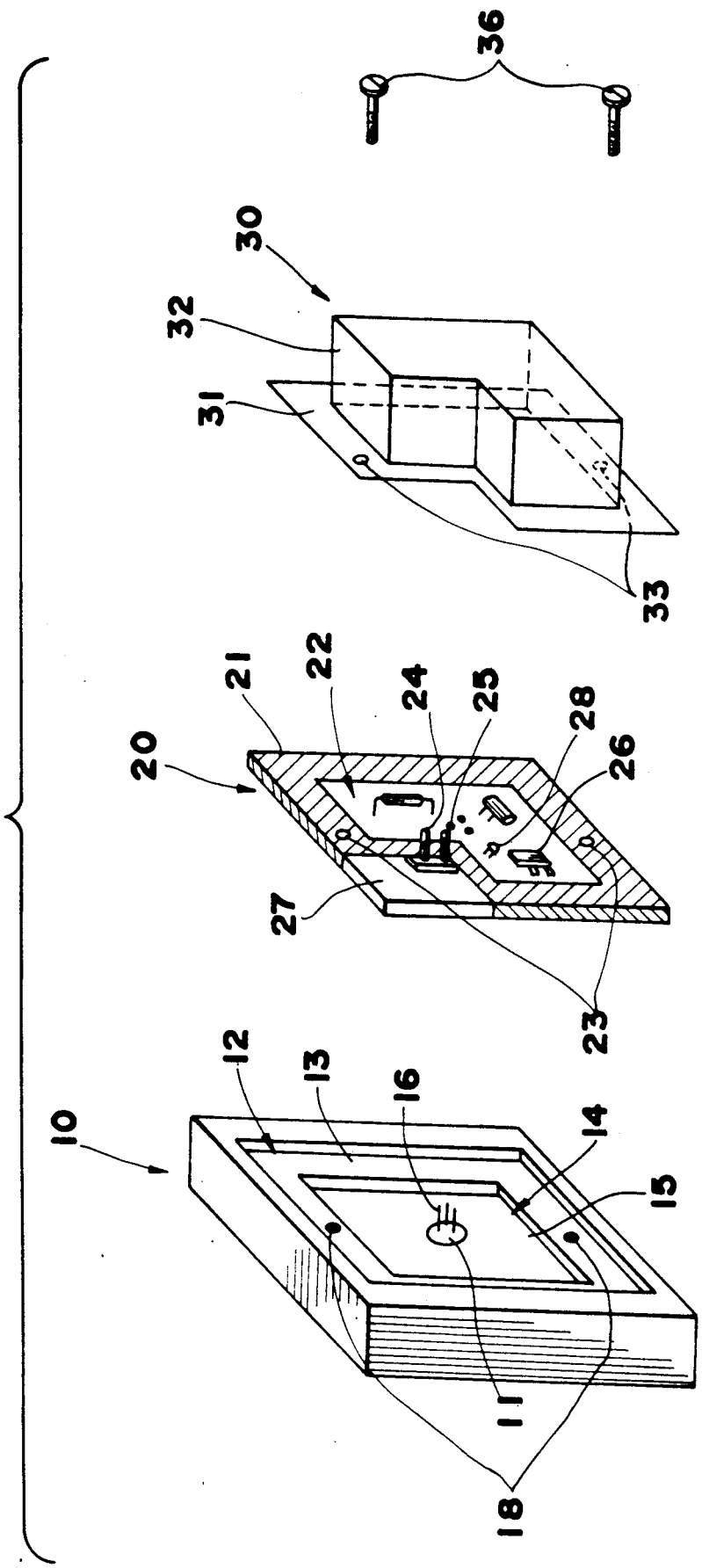
FIG. 1 and FIG. 2 are exploded perspective views of the laser beam emitting unit of the present invention viewed from different directions.
Figure 2:
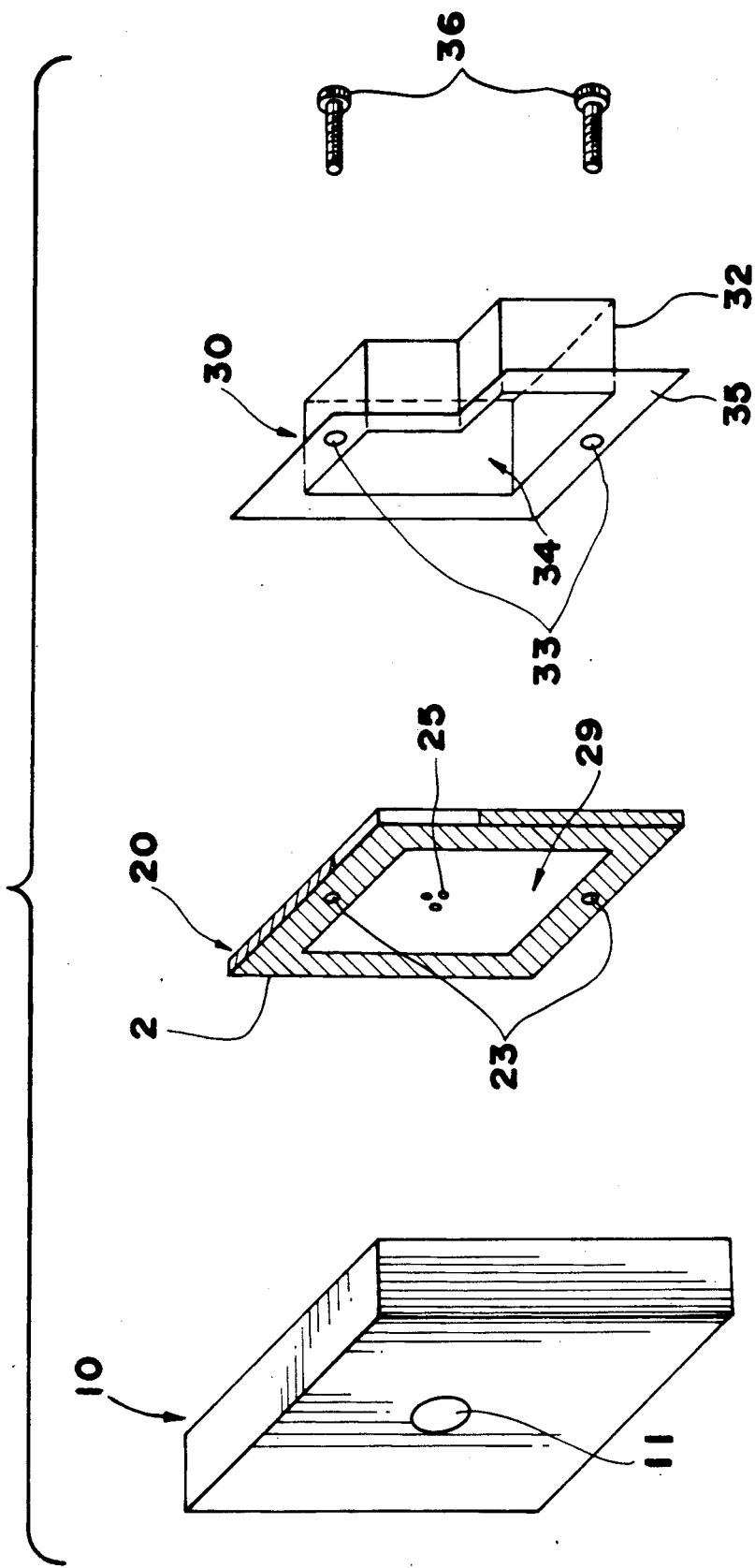

FIG. 1 and FIG. 2 are exploded perspective views of the laser beam emitting unit. FIG. 1 shows an exploded perspective view of the laser beam emitting unit viewed from the rear side, and FIG. 2 shows an exploded perspective view of the laser beam emitting unit viewed from the front side.

The laser beam emitting unit comprises a frame 10 upon which the LD is mounted, a drive circuit board 20, and a cover 30.

LD mounting frame 10 is made of aluminum alloy, a conductive material, and is provided a first concavity 12 and a second concavity 14. Second concavity 14 forms a stepped configuration on first base surface 13 of first concavity 12. LD 11 is mounted on second base surface 15 of second concavity 14 with LD drive pins 16 protruding toward the first and second concavities.

Drive circuit board 20 is made to a size which fits into the first concavity 12 formed in LD mounting frame 10.

A high-frequency generator integrated circuit (IC) 26, comprising a high-frequency pulse generating circuit 22 for driving LD 11, a resistor, condenser and the like are mounted on the first surface (surface on the right side in the drawing) of drive circuit board 20, as shown in FIG. 1. A connecting pin 25 is provided to connect to pins 16 so as to connect LD 11 with the high-frequency pulse generator circuit 22. A high-frequency pulse is superimposed on the direct electrical current in the aforesaid high-frequency pulse generating circuit 22, thereby synthesizing a driving current to drive the LD. A grounding pattern 21 (oblique lined region in the drawing) is formed around high-frequency generating circuit 22 so as to circumscribe said high-frequency generating circuit 22. Further, a connector post 24 is provided exteriorly to high-frequency generating circuit 22 above drive circuit board 20, to connect said circuit 22 with an external power source and data supplying portion. A ground pin is provided on connector post 24 to connect the aforesaid grounding patterns 2 and 21 to and external conductor circuit through said ground pin. That is, LD mounting frame 10 and conductive cover 30, which shall be described later, are securely grounded through ground patterns 2 and 21 and connector post 24. Connector post 24 is connected to the drive circuit by means of a connector cord or the like disposed through the inside of circuit board 20.

On the other hand, a circuit pattern 29 is formed on the second surface side of drive circuit 20, as shown in FIG. 2, and is connected to each element on high-frequency generating circuit 22. Further, a grounding pattern 2 is formed around circuit pattern 29 so as to circumscribe said circuit pattern 29 in the same way as described for the first surface side. Grounding pattern 21 and grounding pattern 2 are connected so as to be electrically unified in an integrated unit. Circuit pattern 29 is made smaller than the opening of second base surface 15 so as to not make contact with first base surface 13 when LD mounting frame 10 and drive circuit board 20 are joined. Conversely, grounding pattern 2 made so as to be electrically connected and adjacent to first base surface 13 when LD mounting frame 10 and drive circuit board 20 are fitted together.

Cover 30 is made of a conductive aluminum alloy and comprises an open portion 34 having a similar, albeit slightly larger, configuration than the exterior shell of high-frequency generating circuit 22, a hood portion 34 which covers said opening 34, and an flange portion 31 disposed around said opening 34. Flange 31 has an abutment 35 which abuts grounding pattern 21, said abutment 35 being configured to conform to grounding pattern 21 when drive circuit board 20 and cover member 30 are fitted together relative to LD mounting frame 10.

Connector post 24 protrudes to the exterior side of cover 30 even when said cover 30 covers LD drive circuit 22 due to the shape of said cover 30. A noise filter 28 is provided directly anterior to connector post 24, to wit, within high-frequency generating circuit 22 to prevent connector post 24 from generating high-frequency electromagnetic waves because said connector post 24 extends to the exterior side of cover 30, and thereby preventing high-frequency noise from being transmitted from the high-frequency circuit to connector post 24.

Screw holes 18, 23 and 33 are respectively provided on LD mounting frame 10, drive circuit board 20 and cover 30 to allow said LD mounting frame 10, drive circuit board 20 and cover 30 to be fixedly attached by screws 36 as a single integrated unit.

Figure 3:
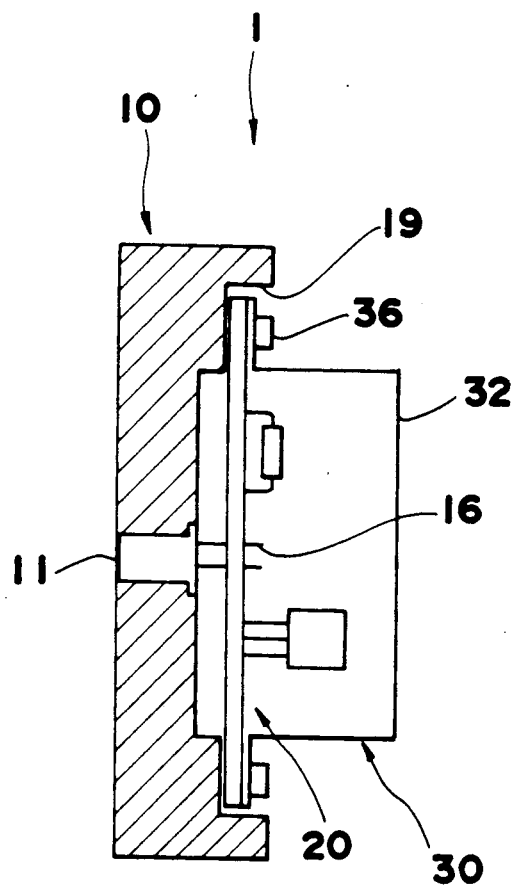
FIG. 3 is a section view of the laser beam emitting unit of the present invention.

FIG. 3 shows a cross section view of the laser beam emitting unit wherein drive circuit board 20 and cover 30 are mounted to LD mounting frame 10 and installed as an integrated unit.

Flange 19, which is formed on LD mounting frame 10 by the provision of first and second convexities to said frame 10, is particularly advantageous inasmuch as said flange 19 not only prevents leakage of electromagnetic waves but also performs the function of a guide when drive circuit board 20 and cover 30 are mounted to LD mounting frame 10.

LD mounting frame 10, cover 30 and grounding patterns 2 and 21 are electrically integrated by the direct contact of first base surface 13 with grounding pattern 2, and abutment 35 of cover member 30 with grounding pattern 21, thereby reliably shielding the electromagnetic waves generated by high-frequency generating circuit 22 and circuit pattern 29.

In the present embodiment, grounding patterns 2 and 21 both completely circumscribe the periphery of the circuits. Although it is preferable to completely circumscribe the periphery of the circuits, it is not necessarily required and an otherwise suitable grounding pattern may be provided. Further, Grounding patterns 2 and 21 need not be formed so as to be connected one to the other.

Although it is preferred that the entire LD drive circuit be shielded, it may be shielded minimally only insofar as that portion of the circuit containing the high-frequency portion is shielded and adverse effects are not produced on other elements.

Figure 4:
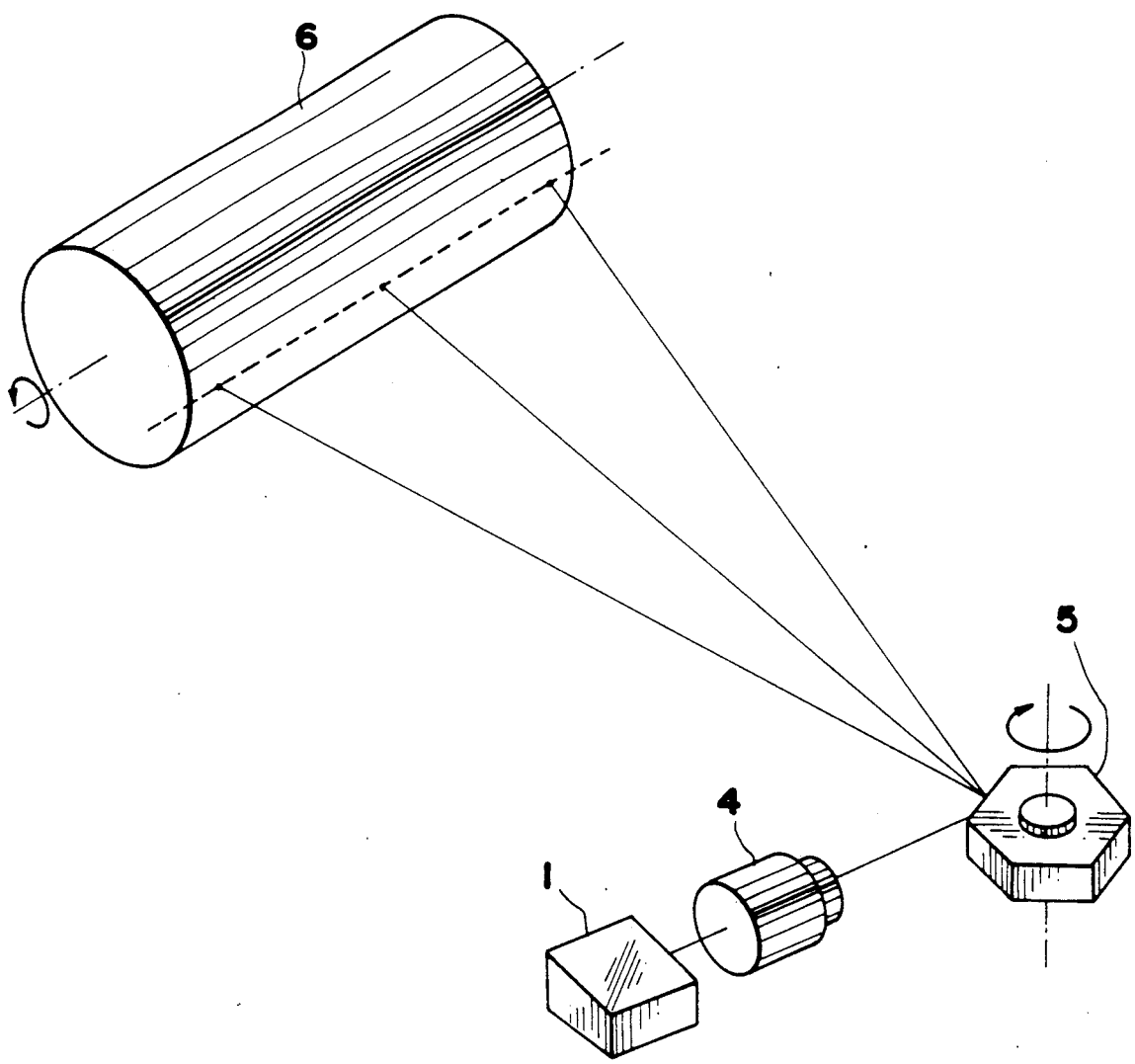
FIG. 4 is a perspective view showing the essential construction of a laser beam printer using the laser beam emitting unit of the present invention.

FIG. 4 shows the basic construction of a laser printer using the laser beam emitting unit of the present invention as the laser light source. A laser beam is output from laser beam emitting unit 1, which is driven in accordance with the input image signals. The aforesaid output laser beam is split into parallel rays by collimator lens 4, then reflected by polygonal lens 5 to scan the surface of photoconductive member 6.

According to the preceding description of the present invention, high-frequency electromagnetic waves emanating from the high-frequency generating circuit are reliably shielded. Thus, the laser beam emitting unit can be rendered extremely compact because only the high-frequency generating circuit is shielded and not the entire laser beam emitting unit, and the number of manufacturing steps is greatly reduced because the wiring access holes need not be plugged or shielded after the external wiring for the high-frequency generating circuit and laser beam emitting unit is completed.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being contained therein.

What is claimed is:

1. A laser beam emitting unit with high frequency noise shutoff, comprising:
    a laser diode;
    a drive circuit for driving said laser diode by a drive current containing a high-frequency pulse;
    a connector terminal to electrically connect said drive circuit with exterior;
    a circuit board having said drive circuit and connector terminal;

a grounding pattern disposed so as to encompass said drive circuit portion excluding said connector terminal on said circuit board;

a conductive support member to support said circuit board so as to shield the entire rear face of said circuit board; and a conductive cover to shield the drive circuit portion of the front face of said circuit board and which is electrically connected to the aforesaid grounding pattern.

2. A laser beam emitting unit as claimed in claim 1 wherein said grounding pattern is peripherally formed at least on the front face of said drive circuit.

3. A laser beam emitting unit as claimed in claim 2 wherein said grounding pattern if further formed peripherally on the rear face of said drive circuit.

4. A laser beam emitting unit as claimed in claim 3 wherein said grounding pattern is formed continuous between the front and rear faces.

5. A laser beam emitting unit as claimed in claim 1 wherein said laser diode is supported by said conductive support member.

6. A laser beam emitting unit with high frequency noise shutoff, comprising:

a drive circuit for driving a laser diode by drive current containing a high-frequency pulse;

a circuit board including said drive circuit and a connecting terminal which are electrically connected therethrough;

a grounding means, formed on said circuit board to encompass said drive circuit except for said connecting terminal, said grounding means grounding said drive circuit;

a first electro-conductive support member having said laser diode and covering said circuit board from one side; and a second electro-conductive support member for covering said circuit board from the other side, said first and second electro-conductive members being in contact with said circuit board at where said grounding means if formed.

* * * * *